United States Patent
Okabe et al.

(10) Patent No.: US 12,402,477 B2
(45) Date of Patent: Aug. 26, 2025

(54) DISPLAY DEVICE AND METHOD OF MANUFACTURING DISPLAY DEVICE

(71) Applicant: SHARP KABUSHIKI KAISHA, Sakai (JP)

(72) Inventors: Tohru Okabe, Sakai (JP); Shoji Okazaki, Sakai (JP); Shinsuke Saida, Sakai (JP); Shinji Ichikawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 368 days.

(21) Appl. No.: 17/927,020

(22) PCT Filed: May 28, 2020

(86) PCT No.: PCT/JP2020/021094
§ 371 (c)(1),
(2) Date: Nov. 22, 2022

(87) PCT Pub. No.: WO2021/240719
PCT Pub. Date: Dec. 2, 2021

(65) Prior Publication Data
US 2023/0217786 A1    Jul. 6, 2023

(51) Int. Cl.
*H10K 59/12* (2023.01)
*H10K 59/80* (2023.01)

(52) U.S. Cl.
CPC ..... *H10K 59/1201* (2023.02); *H10K 59/8723* (2023.02); *H10K 59/8731* (2023.02)

(58) Field of Classification Search
CPC .. H10K 59/8723; H10K 59/88; H10K 59/122; H10K 59/12; H10K 71/166; H10L 23/562; G02F 1/133388; G02F 1/1339
See application file for complete search history.

(56) References Cited

U.S. PATENT DOCUMENTS

| | | | |
|---|---|---|---|
| 2010/0244668 A1* | 9/2010 | Nakamura | H10K 59/88 313/504 |
| 2015/0090982 A1* | 4/2015 | Lin | H10K 50/8428 257/40 |
| 2019/0033628 A1* | 1/2019 | Kawata | G02F 1/13394 |
| 2019/0212780 A1* | 7/2019 | Choi | G09F 9/301 |
| 2020/0027933 A1* | 1/2020 | Heo | H10K 59/8723 |
| 2022/0158117 A1* | 5/2022 | Chang | H10K 59/121 |

FOREIGN PATENT DOCUMENTS

| | | |
|---|---|---|
| CN | 110729325 A | 1/2020 |
| JP | 2013089475 A | 5/2013 |

* cited by examiner

*Primary Examiner* — Alia Sabur
(74) *Attorney, Agent, or Firm* — ScienBiziP, P.C.

(57) ABSTRACT

A display device includes a display panel, wherein the display panel has a display area and a non-display area along a periphery of the display area, the non-display area includes a frame area and also includes an intermediate area between the display area and the frame area, and letting a first areal ratio be an areal fraction of lateral cross-sectional areas of a plurality of spacers per unit area in the display area, a second areal ratio be an areal fraction of lateral cross-sectional areas of the plurality of spacers per unit area in the intermediate area, and a third areal ratio be an areal fraction of lateral cross-sectional areas of the plurality of spacers per unit area in the frame area, the plurality of spacers are arranged so as to satisfy relations, first areal ratio < second areal ratio < third areal ratio.

6 Claims, 13 Drawing Sheets

DISPLAY DEVICE AND METHOD OF MANUFACTURING DISPLAY DEVICE

TECHNICAL FIELD

The present disclosure relates to display devices and methods of manufacturing display devices.

BACKGROUND ART

Patent Literature 1 discloses a light-emitting display device including: a light-emitting region on a substrate; and a non-light-emitting region along a periphery of the light-emitting region. In the light-emitting display device disclosed in Patent Literature 1 (hereinafter, will be referred to as the "known display device"), there are provided spacers in the non-light-emitting region in such a manner as to partition non-light-emitting pixels into one or more pixels.

CITATION LIST

Patent Literature

Patent Literature 1: Japanese Unexamined Patent Application Publication, Tokukai, No. 2013-89475

SUMMARY

Technical Problem

It is disadvantageously difficult to reduce the defect rate of this known display device to sufficient levels in the manufacturing process.

Solution to Problem

The present disclosure, in one aspect thereof, is directed to a display device including a display panel including: a light-emitting element; a transistor layer containing a transistor configured to switch a voltage applied to the light-emitting element; and a plurality of spacers on the transistor layer, wherein the display panel has a display area including the transistor and the light-emitting element and also has a non-display area along a periphery of the display area, the non-display area includes a frame area and also includes an intermediate area between the display area and the frame area, and letting a first areal ratio be an areal fraction of lateral cross-sectional areas of the plurality of spacers per unit area in the display area, a second areal ratio be an areal fraction of lateral cross-sectional areas of the plurality of spacers per unit area in the intermediate area, and a third areal ratio be an areal fraction of lateral cross-sectional areas of the plurality of spacers per unit area in the frame area, the plurality of spacers are arranged so as to satisfy relations, first areal ratio < second areal ratio < third areal ratio.

Additionally, the present disclosure, in one aspect thereof, is directed to a display device including a display panel including: a light-emitting element; a transistor layer containing a transistor configured to switch a voltage applied to the light-emitting element; and a plurality of spacers of a same shape on the transistor layer, wherein the display panel has a display area including the transistor and the light-emitting element and also has a non-display area along a periphery of the display area, the non-display area includes a frame area and also includes an intermediate area between the display area and the frame area, and letting a first count ratio be a count of the plurality of spacers per unit area in the display area, a second count ratio be a count of the plurality of spacers per unit area in the intermediate area, and a third count ratio be a count of the plurality of spacers per unit area in the frame area, the plurality of spacers are arranged so as to satisfy relations, first count ratio < second count ratio < third count ratio.

In addition, the present disclosure, in one aspect thereof, is directed to a method of manufacturing a display device including a display panel including: a light-emitting element; a transistor layer containing a transistor configured to switch a voltage applied to the light-emitting element; and a plurality of spacers on the transistor layer, wherein the display panel has a display area including the transistor and the light-emitting element and also has a non-display area along a periphery of the display area, and the non-display area includes a frame area and also includes an intermediate area between the display area and the frame area, the method including: a step of forming the plurality of spacers on the transistor layer so as to satisfy relations, first areal ratio < second areal ratio < third areal ratio, where the first areal ratio is an areal fraction of lateral cross-sectional areas of the plurality of spacers per unit area in the display area, the second areal ratio is an areal fraction of lateral cross-sectional areas of the plurality of spacers per unit area in the intermediate area, and the third areal ratio is an areal fraction of lateral cross-sectional areas of the plurality of spacers per unit area in the frame area.

DESCRIPTION OF EMBODIMENTS

Figure 1:
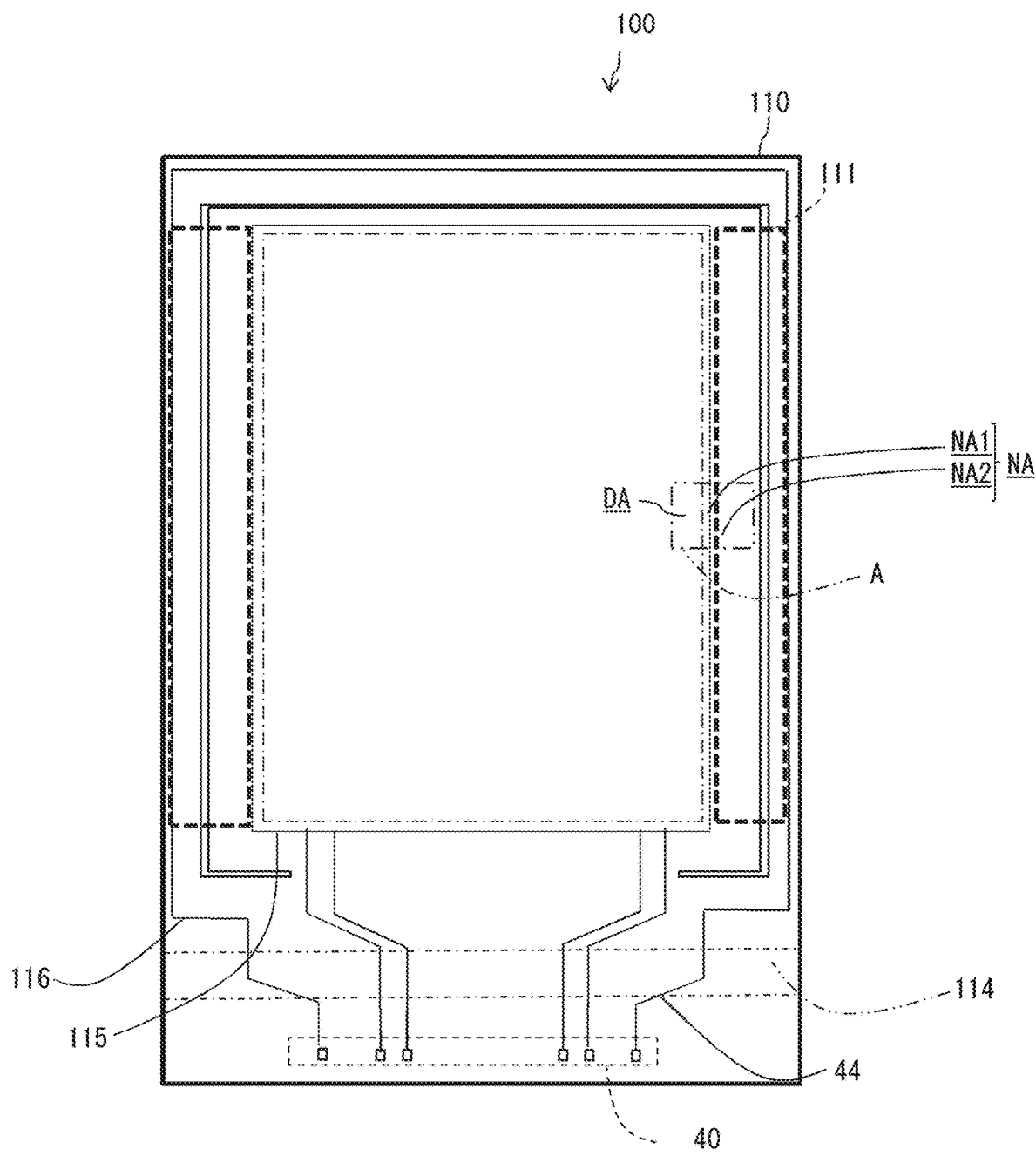
FIG. 1 is a schematic plan view of an exemplary display panel in a display device in accordance with an embodiment.

The following will describe embodiments and variation examples of the present disclosure with reference to drawings. Identical and corresponding elements are denoted by the same reference numerals throughout the following description with reference to drawings, and description thereof is not repeated. Additionally, the embodiments and variation examples are mere examples, and the scope of the present disclosure is by no means limited to the embodiments and variation examples. Apart from the embodiments and variation examples, various modifications can be made in accordance with, for example, designs without departing from the technical concept of the present disclosure.

Meanwhile, in the present specification, expressions like "component A is in the same layer as component B" indicate that components A and B are formed of the same material and in the same process or step, expressions like "component A underlies/is below component B" indicate that component A is formed in an earlier process or step than component B, and expressions like "component A overlies/is on/is above component B" indicate that component A is formed in a later process or step than component B. The upward direction, throughout the present specification, is defined as the direction from an underlying layer toward an overlying layer in a display device 100.

Embodiments

The display device 100 in accordance with an embodiment is, for example, an organic EL (electroluminescence) display device in which a light-emitting element is provided for each pixel. In the present specification, each light-emitting element includes a first electrode (anode) 22, a hole transport layer 24a, a light-emitting layer 24b, an electron transport layer 24c, and a second electrode (cathode) 25, all of which will be described later in detail.

Figure 2:
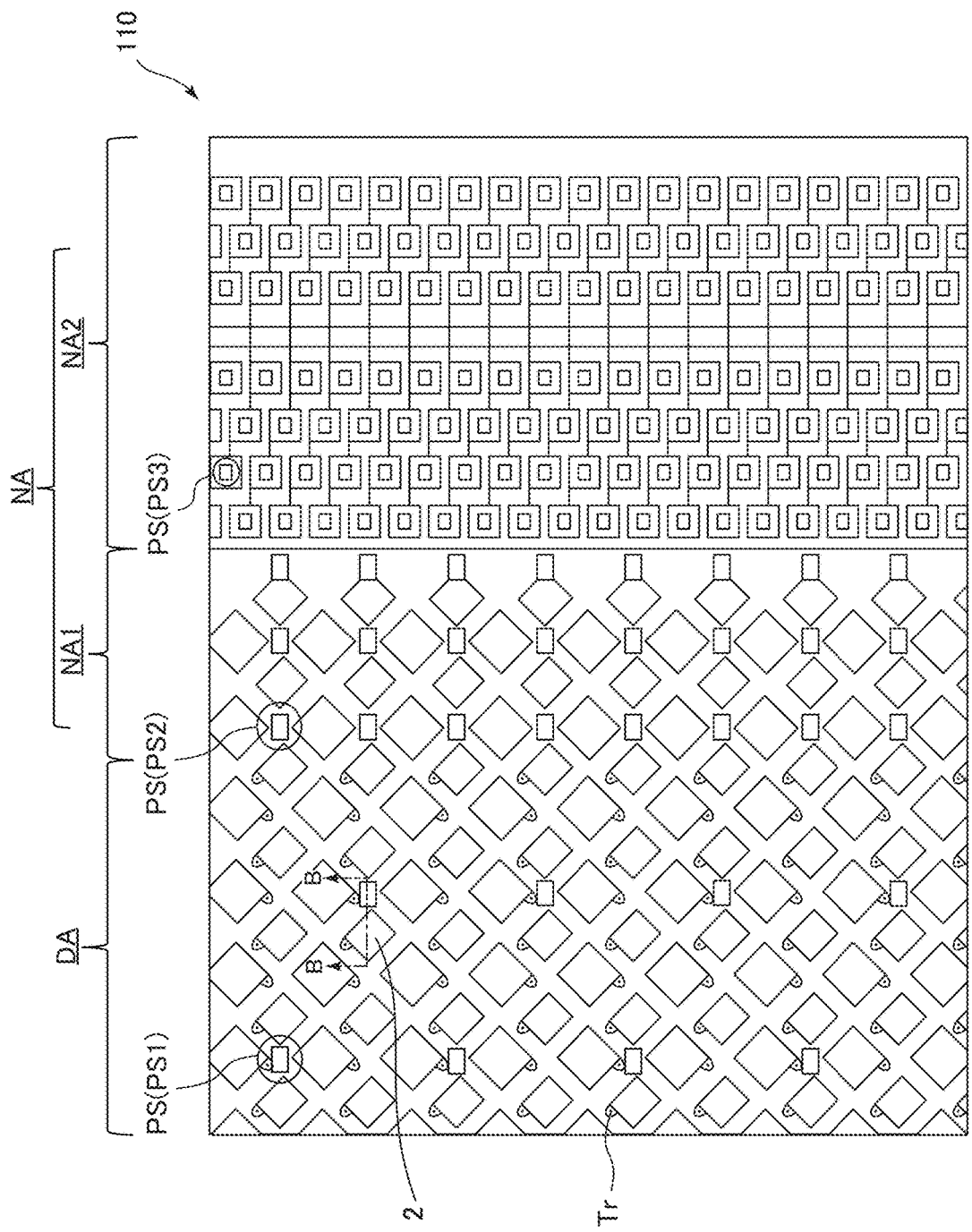
FIG. 2 is a partial enlarged view of region A of the display panel shown in FIG. 1.
Figure 3:
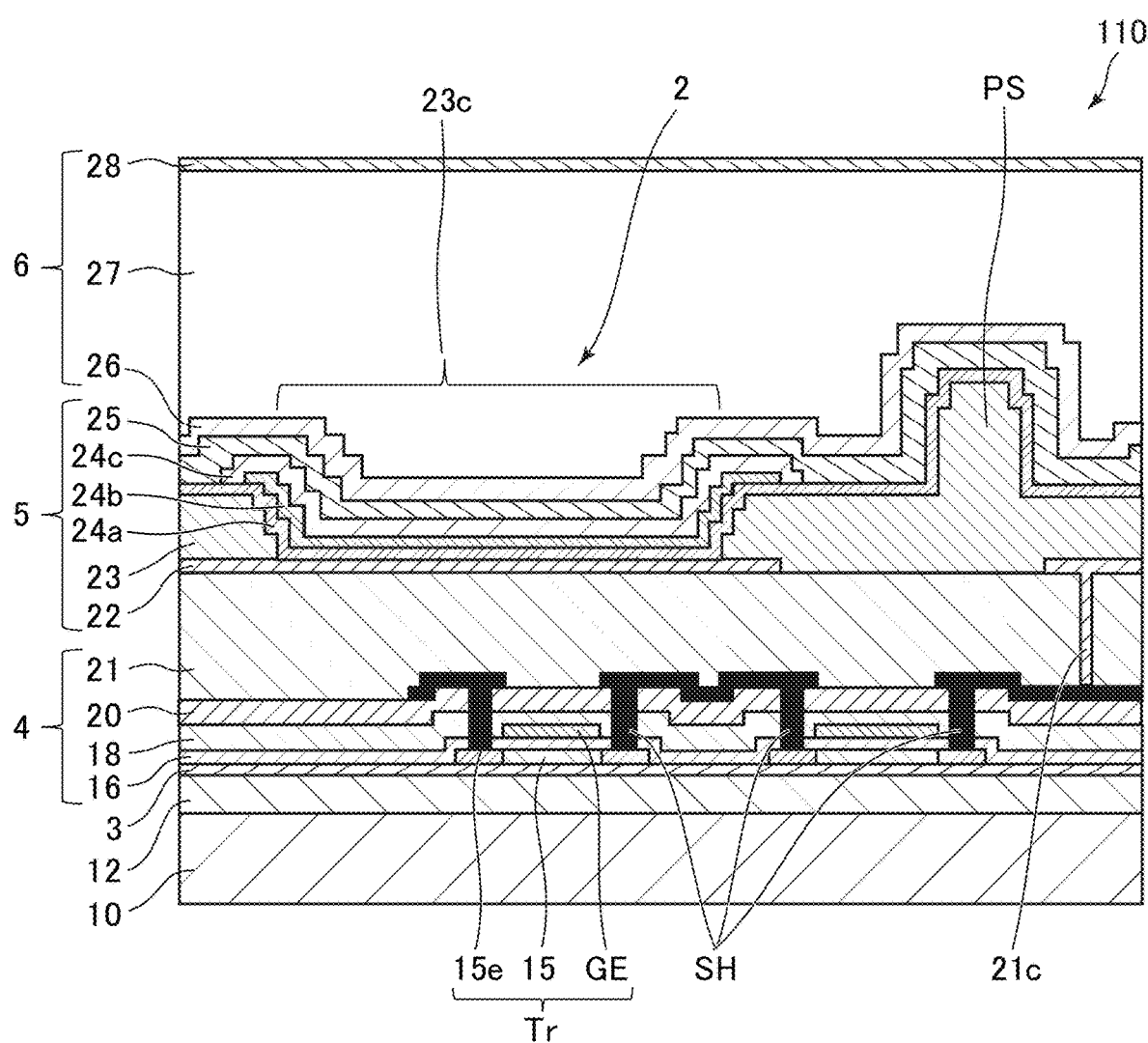
FIG. 3 is a schematic B-B cross-sectional view of the display panel shown in FIG. 2.

The following description will discuss an example of a display panel 110 included in the display device 100 in accordance with an embodiment with reference to FIGS. 1 to 3. FIG. 1 is a schematic plan view of an example of the display panel 110 in the display device 100 in accordance with an embodiment. FIG. 2 is a partial enlarged view of region A of the display panel 110 shown in FIG. 1. FIG. 3 is a schematic B-B cross-sectional view of the display panel 110 shown in FIG. 2. FIG. 3 shows a cross-sectional structure of the display panel 110 in a display area DA.

Referring to FIG. 1, the display panel 110 has the display area DA and a non-display area NA. The display area DA is an effective display area where an image is actually displayed. In the display area DA are there provided: a light-emitting element; and a thin film transistor (TFT) Tr for switching the voltage applied to this light-emitting element. Note that this thin film transistor Tr corresponds to the transistor of the present disclosure. Note that the thin film transistor Tr is connected in series with the light-emitting element. In addition, a main line (first frame line 115) for applying a power supply voltage ELVDD (high voltage) to the thin film transistor Tr is disposed as a power supply line along the circumference of the display area DA. Furthermore, a main line (second frame line 116) for applying a power supply voltage ELVSS (low voltage) to the light-emitting element is disposed as a power supply line around the first frame line 115 in the non-display area NA.

The non-display area NA is provided along the circumference of the display area DA and is an area where no image is displayed. The non-display area NA includes: a frame-shaped frame area NA2; and an intermediate area NA1 between this frame area NA2 and the display area DA. The frame area NA2 is an area where a control circuit 111 for controlling an image signal is mounted. Meanwhile, the intermediate area NA1 is a region where there are provided dummy pixels. Note that a dummy pixel is, for example, a pixel used in a test. Unlike a pixel in the display area DA, no thin film transistor Tr for switching the voltage applied to the light-emitting element is connected to the dummy pixel.

Structure of Display Panel

Referring to FIG. 3, a detailed description is now given of a structure of the display panel 110. Referring to FIG. 3, the display panel 110 includes a support substrate 10, a resin layer 12, a barrier layer 3, a TFT layer 4, a light-emitting element layer 5, and a sealing layer 6, which are provided in this order when viewed from below. The display panel 110 may include, in an overlying layer of the sealing layer 6, for example, a functional film having, for example, an optical compensation function, a touch sensor function, and a protection function.

The support substrate 10 may be, for example, a glass substrate. The resin layer 12 on the support substrate 10 may be made of, for example, a photosensitive organic material such as a polyimide or an acrylic. The barrier layer 3 is provided on the resin layer 12. The barrier layer 3 prevents, for example, water and oxygen from reaching the TFT layer 4 and the light-emitting element layer 5 on the barrier layer 3 while the display device 100 is in use. The barrier layer 3 may include, for example, a silicon oxide film, a silicon nitride film, a silicon oxynitride film, or a stack of these films. Note that on the barrier layer 3, the sealing layer 6 is further stacked in addition to the TFT layer 4 and the light-emitting element layer 5 described above.

The TFT layer 4 includes a semiconductor layer 15, a first inorganic layer 16, a gate electrode GE, a second inorganic layer 18, a third inorganic layer 20, a source line SH, and a planarization film 21, which are provided in this order when viewed from below. The semiconductor layer 15 and the source line SH are electrically connected to each other in a conductive region 15e of the semiconductor layer 15. The semiconductor layer 15, the first inorganic layer 16, and the gate electrode GE constitute the thin film transistor Tr. Note that the semiconductor layer 15 is made of, for example, a low-temperature polycrystalline silicon (LTPS; low-temperature polycrystalline silicon) or an oxide semiconductor.

FIG. 3 shows the thin film transistor Tr as having a top-gate structure in which the semiconductor layer 15 serves as a channel. Alternatively, the thin film transistor Tr may have a bottom-gate structure. The gate electrode GE or the source line SH may contain, for example, at least one of aluminum (Al), tungsten (W), molybdenum (Mo), tantalum (Ta), chromium (Cr), titanium (Ti), and copper (Cu). The gate electrode GE or the source line SH may contain a monolayer film of one of these metals or a stack of (some of) these films. In addition, a gate wire (not shown), a routing line 44, a terminal section 40, a frame wire (not shown), a capacitor wire (not shown), an initialization signal wire (not shown), a source electrode (not shown), a drain electrode (not shown), a high-voltage power supply wire (not shown), the first frame line 115, a low-voltage power supply wire (not shown), the second frame line 116, and a connection wire (not shown) may have the same structure as the gate electrode GE and the source line SH described above.

The first inorganic layer (gate insulation film) 16, the second inorganic layer 18, and the third inorganic layer 20 include, for example, a CVD (chemical vapor deposition)-formed film of silicon oxide ($SiO_x$) or silicon nitride ($SiN_x$) or a stack of these films. The planarization film 21 is made of, for example, a photosensitive organic material, such as a polyimide or an acrylic, that can be provided by printing or coating technology.

The light-emitting element layer 5 contains a light-emitting element. The light-emitting element layer 5 includes: the first electrode 22; an edge cover film 23 covering an edge of the first electrode 22; the hole transport layer 24a; the light-emitting layer 24b; the electron transport layer 24c; and the second electrode 25, which are provided in this order when viewed from below. In an embodiment, at least one of the hole transport layer 24a, the light-emitting layer 24b, and the electron transport layer 24c is formed by vapor deposition in the light-emitting element layer 5. In addition, each pixel 2 includes one light-emitting layer 24b and one electron transport layer 24c. On the other hand, the hole transport layer 24a is provided as a common layer that is common to the plurality of pixels 2.

The light-emitting element layer 5, corresponding to each pixel 2, contains a light-emitting element (e.g., organic light-emitting diode) including the first electrode 22, the hole transport layer 24a, the light-emitting layer 24b, the electron transport layer 24c, and the second electrode 25 and further contains a pixel circuit for driving this. In the TFT layer 4 underlying the light-emitting element layer 5, one thin film transistor Tr is formed for each pixel circuit, and voltage is applied to the pixel circuit via the thin film transistor Tr.

The first electrode 22 is disposed in a location that overlaps a contact hole 21c in the planarization film 21 in a plan view of the display panel 110. Then, the first electrode 22 is electrically connected to the source line SH via the contact hole 21c. This structure enables an image signal to be fed to the first electrode 22 via the source line SH. Note that the first electrode 22 may have a thickness of, for example, 50 nm to 100 nm, both inclusive. One first electrode 22 is provided for each plurality of pixels 2. The first electrode 22 includes, for example, a stack of a layer of a conductive oxide such as ITO (indium tin oxide) and a Ag-containing alloy layer so as to reflect light.

The second electrode 25 is provided as a common layer that is common to the plurality of pixels 2 and may be made of, for example, a conductive oxide such as ITO (indium tin oxide) or IZO (indium zinc oxide).

The edge cover film 23 is an insulation film provided in a location covering an edge of the first electrode 22. The edge cover film 23 is preferably an organic insulation film. The edge cover film 23 has an opening 23c formed therein for each plurality of pixels 2 in such a manner that the first electrode 22 is partially exposed in these openings 23c.

Here, when the light-emitting element layer 5 is an OLED layer, holes are injected from the first electrode 22 to the hole transport layer 24a, and electrons are injected from the second electrode 25 to the electron transport layer 24c, in response to a voltage applied to the first electrode 22 and the second electrode 25. The injected holes and electrons then recombine in the light-emitting layer 24b, which produces excitons that transition to the ground state to emit light. Since the second electrode 25 is transparent, and the first electrode 22 is reflective, the light discharged from the light-emitting layer 24b travels upward. In other words, the display device 100 is a top-emission display device.

The sealing layer 6 includes a first inorganic sealing film 26 on the second electrode 25, an organic sealing film 27 on the first inorganic sealing film 26, and a second inorganic sealing film 28 on the organic sealing film 27. The sealing layer 6 is capable of preventing, for example, water and oxygen from reaching the light-emitting element layer 5. The first inorganic sealing film 26 and the second inorganic sealing film 28 may be made of, for example, a CVD-formed film of silicon oxide, silicon nitride, or silicon oxynitride or a stack of these films. The organic sealing film 27 may be made of a photosensitive organic material, such as a resist including a polyimide and an acrylic, that can be provided by printing or coating technology.

Note that as shown in FIG. 1, in the frame area NA2, the control circuit 111 including, for example, thin film transistors is mounted in the TFT layer 4. This control circuit 111 may be, for example, a display-use drive circuit (GDM; gate driver monolithic circuit) formed simultaneously with the pixel circuit in the step of forming the TFT layer 4.

Method of Manufacturing Display Device

Figure 4:
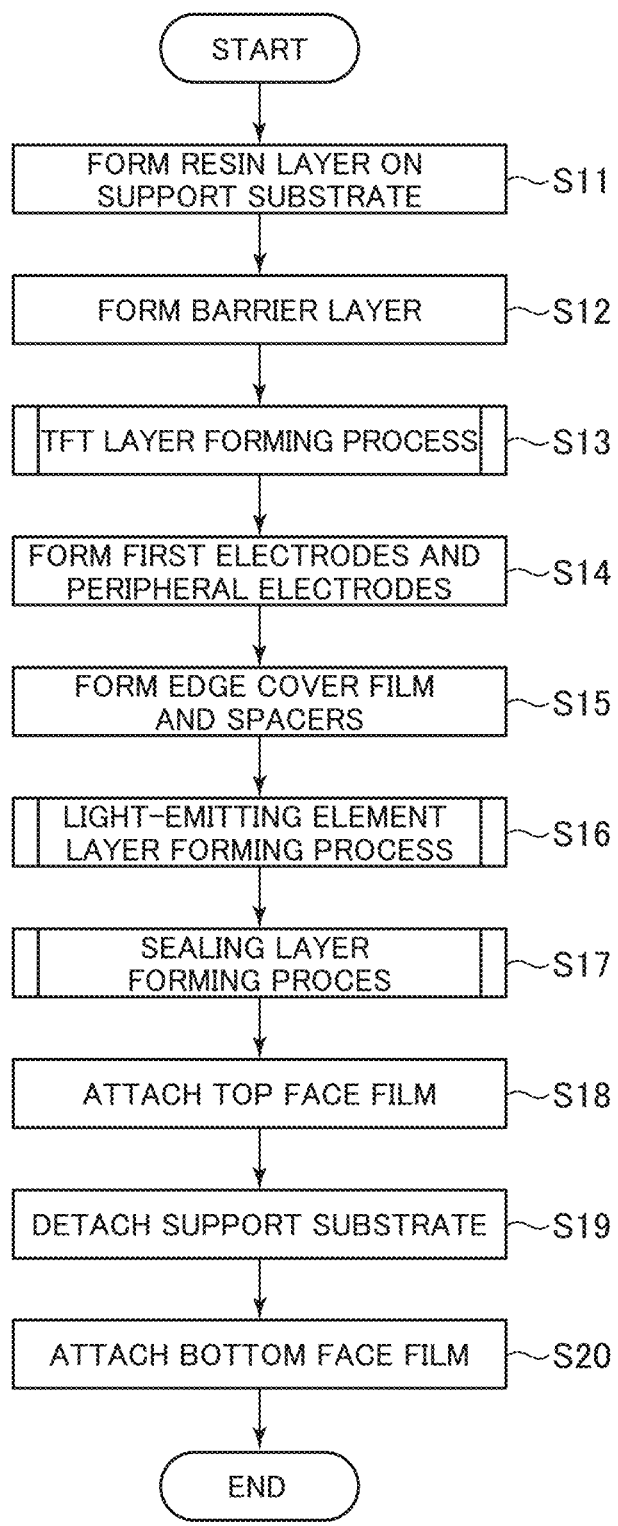
FIG. 4 is a flow chart representing an exemplary method of manufacturing a display device in accordance with an embodiment of the present disclosure.
Figure 5:
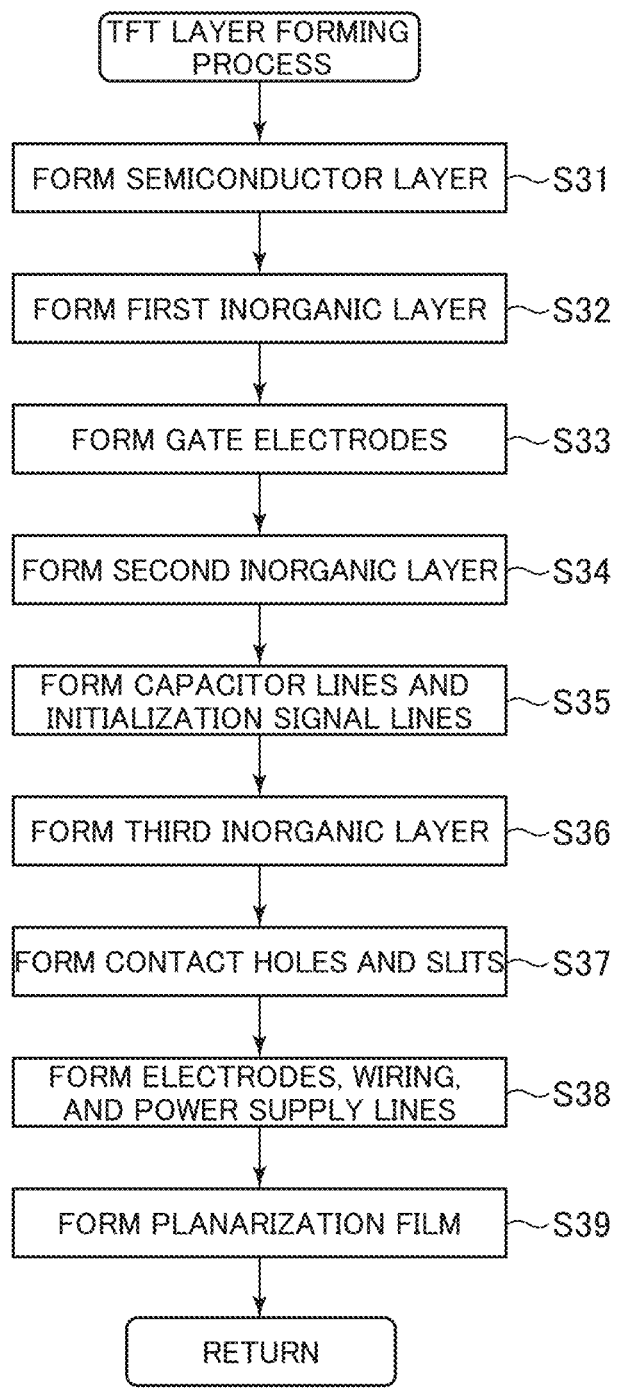
FIG. 5 is a flow chart representing an exemplary TFT layer forming process in the method of manufacturing the display device shown in FIG. 4.
Figure 6:
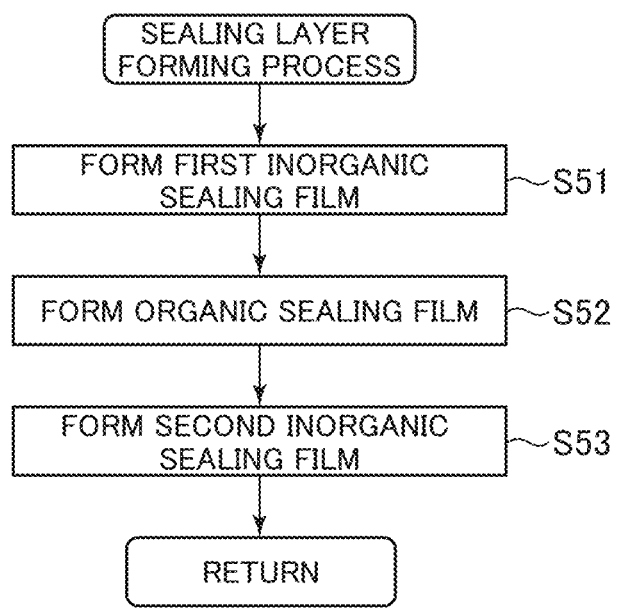
FIG. 6 is a flow chart representing an exemplary sealing layer forming process in the method of manufacturing the display device shown in FIG. 4.

Next, a description is given of a method of manufacturing the display device 100 with reference to FIGS. 4 to 6 as well as FIGS. 1 to 3 mentioned above. FIG. 4 is a flow chart representing an exemplary method of manufacturing the display device 100 in accordance with an embodiment of the present disclosure. Referring to FIG. 4, first, in the display device 100, the resin layer 12 is formed on the support substrate 10 (step S11). Next, the barrier layer 3 is formed on the resin layer 12 by plasma CVD (chemical vapor deposition) (step S12). After forming the barrier layer 3, a TFT layer forming process is performed (step S13). More specifically, a TFT layer forming process is performed as shown in FIG. 5. FIG. 5 is a flow chart representing an exemplary TFT layer forming process in the method of manufacturing the display device 100 shown in FIG. 4.

After the barrier layer 3 is formed in step S12, a semiconductor film is formed on the barrier layer 3 in the display area DA by plasma CVD as shown in FIG. 5. Then, the semiconductor layer 15 is formed from this semiconductor film by photolithography (step S31).

Next, the first inorganic layer 16 is formed on the semiconductor layer 15 by plasma CVD (step S32). Then, the gate electrodes GE are formed on the first inorganic layer 16 (step S33). In other words, a first metal layer is formed on the first inorganic layer 16 by sputtering. Then, the gate electrodes GE and gate lines (not shown) are formed from the first metal layer on the first inorganic layer 16 in the display area DA by photolithography. In addition, the routing lines 44, the terminals for the terminal section 40, and frame lines (not shown) connected to the terminal sections 40 are all formed from the first metal layer on the first inorganic layer 16 in the frame area NA2 by photolithography.

Furthermore, the second inorganic layer 18 is formed on the gate electrodes GE, the gate lines, the routing lines 44, the frame lines (not shown), and the terminal sections 40 by plasma CVD (step S34).

Next, capacitor lines (not shown) and initialization signal lines (not shown) are formed on the second inorganic layer 18 (step S35). In other words, a second metal layer is formed on the second inorganic layer 18 by sputtering. Then, capacitor lines and initialization signal lines are formed by photolithography through patterning of this second metal layer.

Next, the third inorganic layer 20 is formed on the second inorganic layer 18 by plasma CVD (step S36). Then, the contact holes 21c are formed in the third inorganic layer 20, the second inorganic layer 18, and the first inorganic layer 16 in the display area DA by photolithography. In addition, slits (not shown) are formed in the third inorganic layer 20, the second inorganic layer 18, the first inorganic layer 16, and the barrier layer 3 in a bending portion 114 in the frame area NA2. Additionally, contact holes (not shown) are formed on the ends of the routing lines 44 and the frame lines (not shown) in the frame area NA2 (step S37).

After the aforementioned contact holes and slits are formed, electrodes, wiring, and power supply lines are formed (step S38). In other words, a third metal layer is formed by sputtering on a stack body in which the aforementioned contact holes and slits are formed. Then, the source electrodes, the drain electrodes, the source lines SH, the high-voltage power supply lines, and the low-voltage power supply lines are formed in the display area DA by photolithography. In addition, connection wiring (not shown) electrically connected to the routing lines 44 and the frame lines via the first frame lines 115, the second frame lines 116, and the contact holes is formed in the frame area NA2 by photolithography.

After the electrodes, wiring, and power supply lines are formed as described above, the planarization film 21 is formed on the third inorganic layer 20 by coating (step S39). In this planarization film 21, the contact holes 21c are formed by photolithography, which completes the formation of the TFT layer 4.

The first electrodes 22 and peripheral electrodes 251 (see FIG. 7 detailed later) are formed as shown in FIG. 4 after the planarization film 21 is formed (step S14).

Next, the edge cover film 23 that covers parts of the first electrodes 22 and the peripheral electrodes 251 is formed simultaneously with photospacers PS (step S15). The edge cover film 23 and the photospacers PS may be made of, for example, a photosensitive organic material, such as a polyimide or an acrylic, that can be provided by printing or coating technology. Note that the photospacers PS are provided in such a manner that the non-display area NA includes more photospacers PS per unit area than does the display area DA. After the edge cover film 23 and the photospacers PS are formed, a light-emitting element layer forming process is performed (step S16). Details will be given later about the process of forming the edge cover film 23 and the photospacers PS shown in step S15 and about the light-emitting element layer forming process shown in step S16.

After the light-emitting element layer forming process, a sealing layer forming process is performed (step S17). Specifically, a sealing layer forming process is performed as shown in FIG. 6. FIG. 6 is a flow chart representing an exemplary sealing layer forming process in the method of manufacturing the display device 100 shown in FIG. 4. Referring to FIG. 6, the first inorganic sealing film 26 is formed on the second electrode 25 by plasma CVD (step S51). The organic sealing film 27 is further formed by applying a resin onto the first inorganic sealing film 26 (step S52). Next, the second inorganic sealing film 28 is formed on the organic sealing film 27 by plasma CVD (step S53), which completes the formation of the sealing layer 6.

Referring to FIG. 4, a top face film (not shown) is attached onto the sealing layer 6 formed in the sealing layer forming process (step S18). Next, the support substrate 10 is detached by projecting a laser beam toward the resin layer 12 from opposite the surface of the support substrate 10 on which the TFT layer 4 is provided (step S19). After the support substrate 10 is detached, a bottom face film (not shown) is attached to the bottom of the resin layer 12 (the surface of the resin layer 12 on which the support substrate 10 is provided) (step S20).

A plurality of individual pieces are obtained by separating a stack body including the resin layer 12, the barrier layer 3, the TFT layer 4, the light-emitting element layer 5, and the sealing layer 6 all prepared by these steps and processes. Then, an electronic circuit board (not shown) such as an IC chip is attached to the terminal section 40, which completes the manufacture of the display device 100.

Edge Cover Film, Photospacers, and Light-Emitting Element Layer Forming Process

Figure 7:
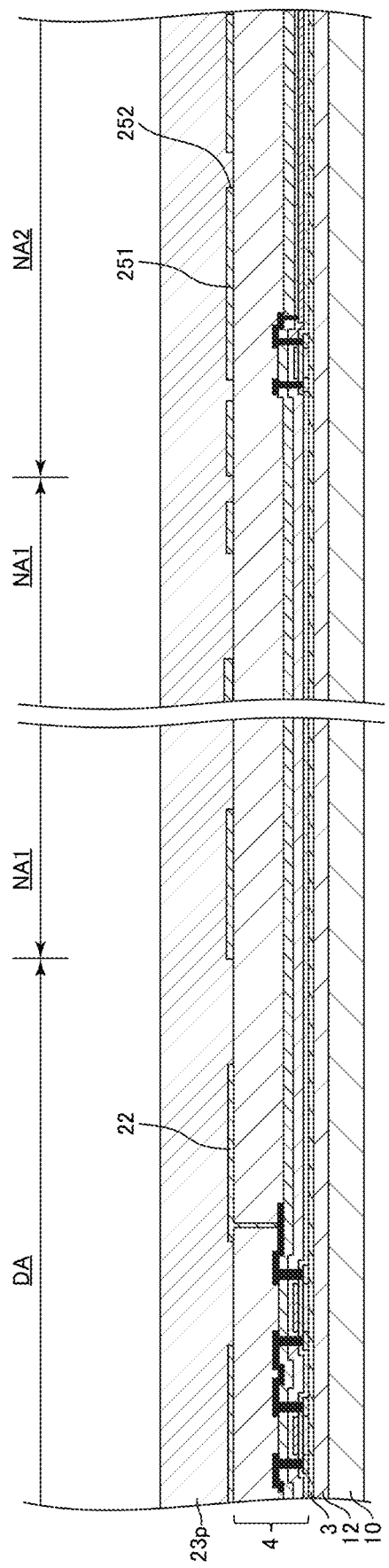
FIG. 7 is a schematic cross-sectional view illustrating an exemplary photospacer forming process in the method of manufacturing a display device in accordance with an embodiment of the present disclosure.
Figure 8:
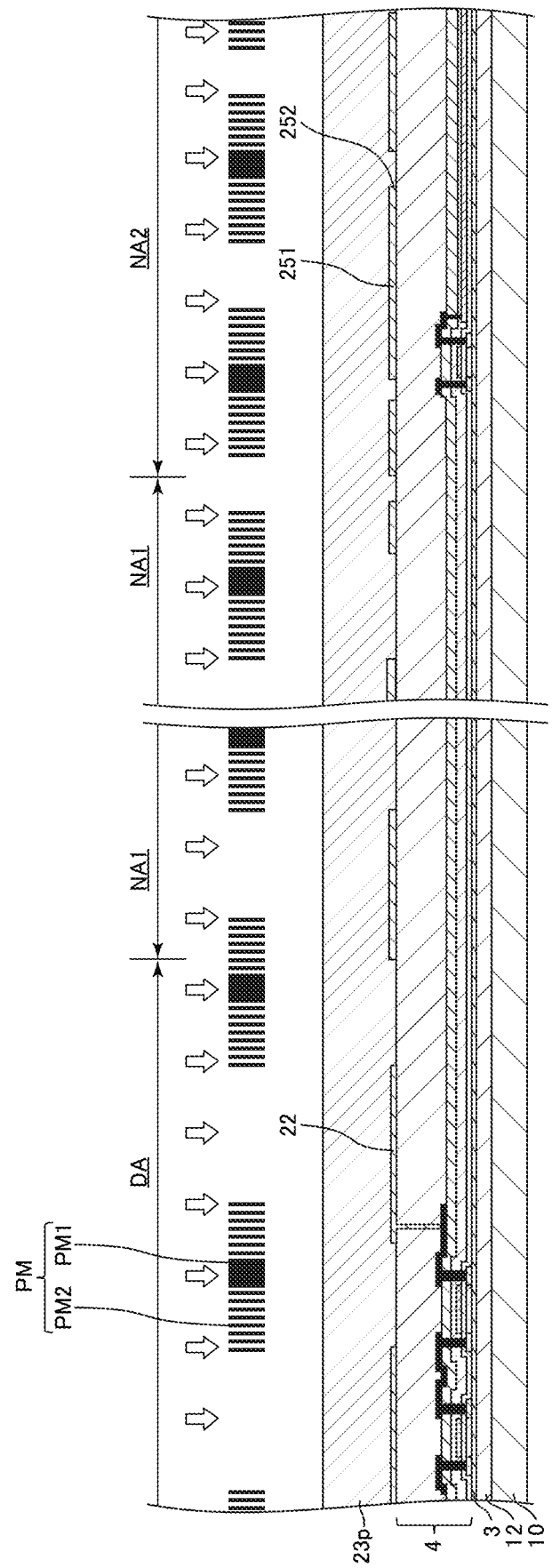
FIG. 8 is a schematic cross-sectional view illustrating an exemplary photospacer forming process in the method of manufacturing a display device in accordance with an embodiment of the present disclosure.
Figure 9:
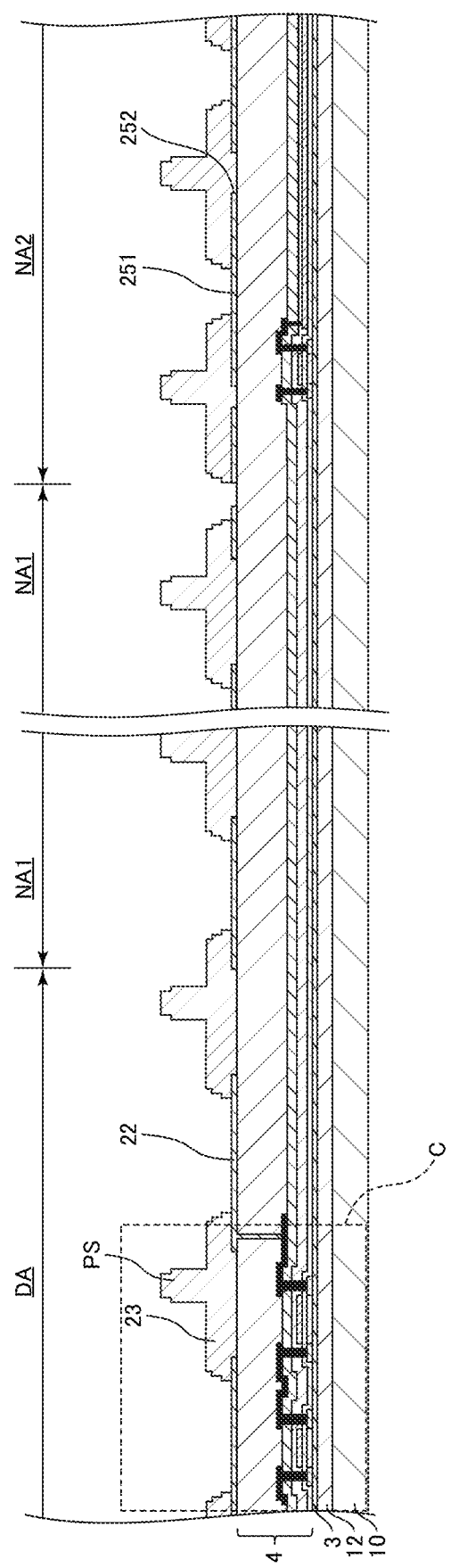
FIG. 9 is a schematic cross-sectional view illustrating an exemplary photospacer forming process in the method of manufacturing a display device in accordance with an embodiment of the present disclosure.
Figure 10:
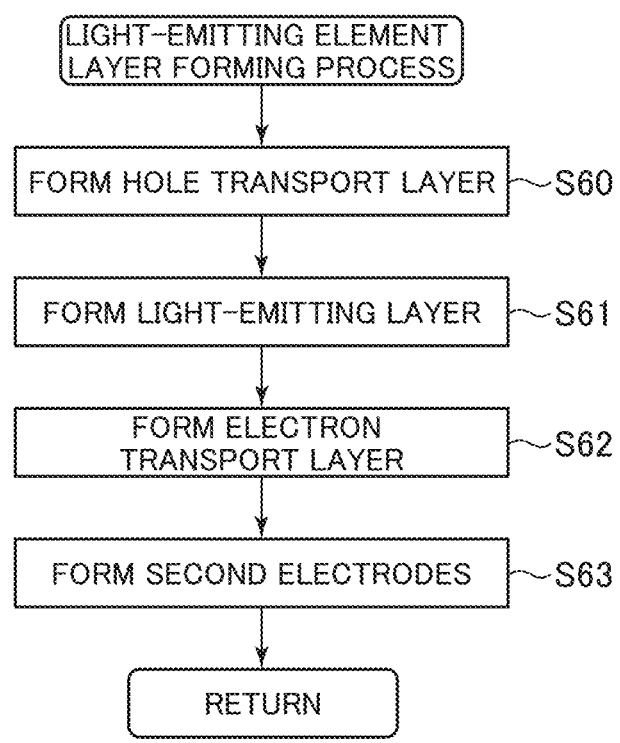
FIG. 10 is a flow chart representing an exemplary light-emitting element layer forming process in the method of manufacturing the display device shown in FIG. 4.
Figure 11:
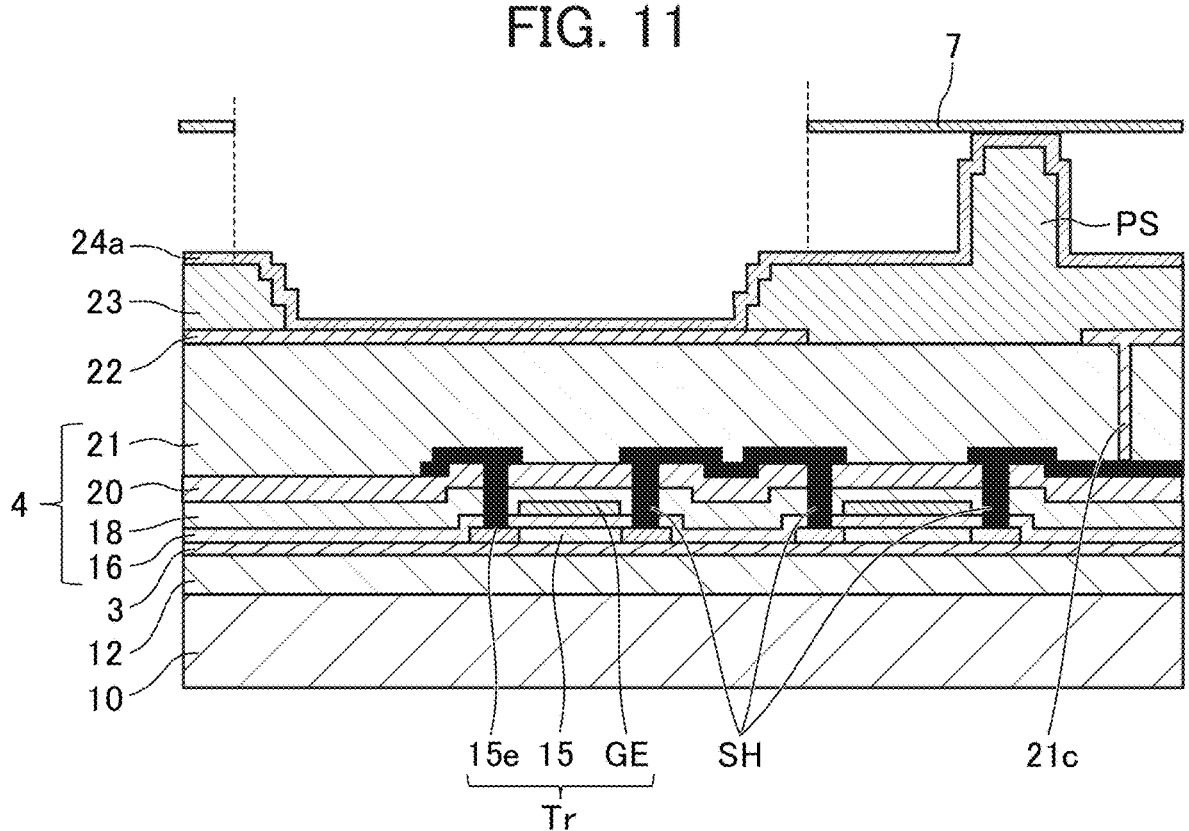
FIG. 11 is a schematic cross-sectional view illustrating an exemplary light-emitting element layer forming process in the method of manufacturing a display device in accordance with an embodiment of the present disclosure.
Figure 12:
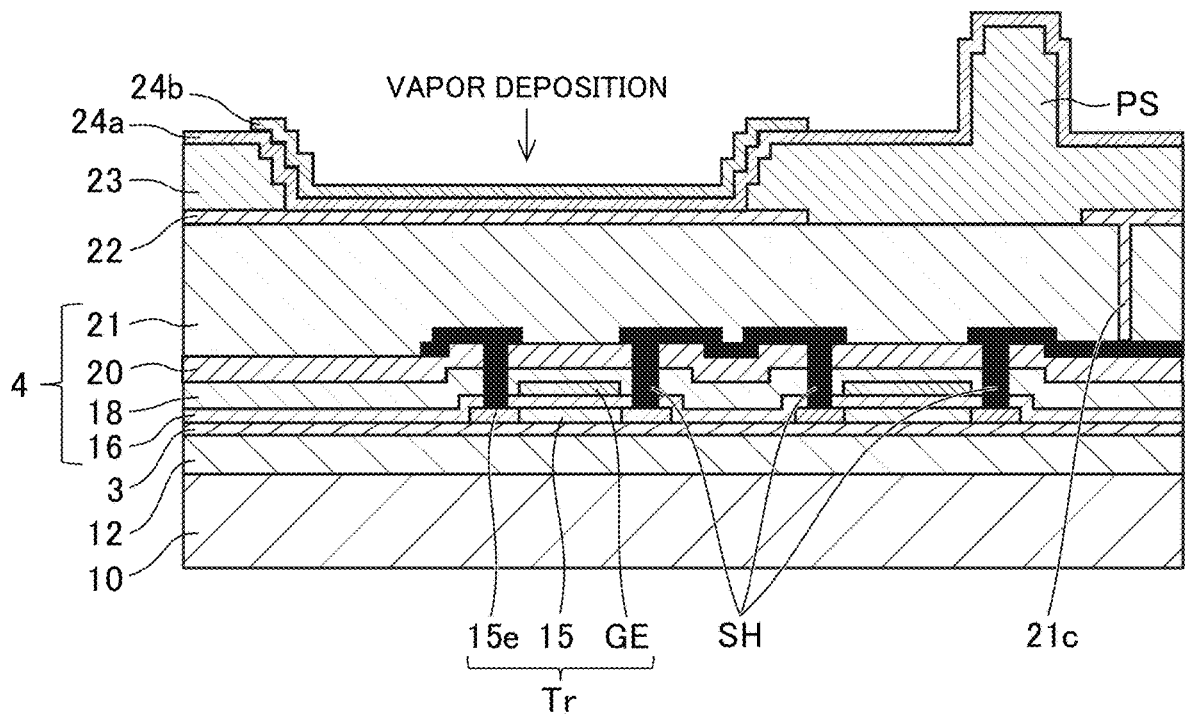
FIG. 12 is a schematic cross-sectional view illustrating an exemplary light-emitting element layer forming process in the method of manufacturing a display device in accordance with an embodiment of the present disclosure.

Next, details are given about the process of forming the edge cover film 23 and the photospacers PS and about the process of forming the light-emitting element layer 5 in the aforementioned method of manufacturing the display device 100 with reference to FIGS. 7 to 12. FIGS. 7 to 9 are schematic cross-sectional views illustrating an exemplary process of forming the photospacers PS in the method of manufacturing the display device 100 in accordance with an embodiment of the present disclosure. FIG. 10 is a flow chart representing an exemplary light-emitting element layer forming process in the method of manufacturing the display device 100 shown in FIG. 4. In addition, FIGS. 11 and 12 are schematic cross-sectional views illustrating an exemplary light-emitting element layer forming process in the method of manufacturing the display device 100 in accordance with an embodiment of the present disclosure. Note that FIGS. 11 and 12 are enlarged views of the area shown in region C shown in FIG. 9.

Referring to FIG. 4, after the TFT layer forming process is performed (step S13) and the first electrodes 22 and the peripheral electrodes 251 are formed (step S14), the edge cover film 23 and the photospacers PS are formed on the TFT layer 4 (step S15). Specifically, as shown in FIG. 7, a photosensitive resin 23p, which is a component material of the edge cover film 23, is applied on the planarization film 21, the first electrodes 22, and the peripheral electrodes 251 in the TFT layer 4 by, for example, inkjet technology. Note that the photosensitive resin 23p is a positive photosensitive resin. Next, as shown in FIG. 8, a photomask PM, which is a halftone mask with a plurality of openings, is positioned above the photosensitive resin 23p applied in this manner. Then, the photosensitive resin 23p is half exposed by projecting light from above the photomask PM. Thereafter, as shown in FIG. 9, after the photomask PM is removed, and the exposed photosensitive resin 23p is washed away in a development solution, the photosensitive resin 23p is baked.

Here, half exposure can be performed by either a slit method in which an object is exposed using a mask (slit mask) with slits or a half transmission method using a mask (halftone mask) with a half transmission region.

For instance, a slit mask has fine openings (slit portions PM2) smaller than the resolution of an exposure device. These slit portions PM2 block the passage of light, thereby achieving half-level exposure. Therefore, three exposure levels (i.e., exposed parts, half-level exposed parts, and unexposed parts) can be achieved in a single exposure. Therefore, three states (i.e., those parts which retain the initial thickness, those which have half-level thickness, and those which have been removed) can be achieved by exposing the positive photosensitive resin 23p using a slit mask.

In other words, the photosensitive resin 23*p* remains in parts where light is blocked by the photomask PM in the step shown in FIG. 9. To describe it in detail, the edge cover film 23 is provided in the parts of the photosensitive resin 23*p* that overlap the slit portions PM2 (half-level exposed parts) of the photomask PM in a plan view of the display panel 110. The photospacers PS are formed in the parts of the photosensitive resin 23*p* that overlap light-blocking sections PM1 (unexposed parts) of the photomask PM in a plan view of the display panel 110. On the other hand, the photosensitive resin 23*p* is removed from the parts exposed through the openings in the photomask PM. Hence, the photospacers PS and the edge cover film 23 can be simultaneously formed in the display area DA, openings 252 in the peripheral electrodes 251 in the frame area NA2, and the rims of the openings 252 in the peripheral electrodes 251.

After the edge cover film 23 and the photospacers PS are formed in this manner, the hole transport layer 24*a* is formed by vapor deposition as shown in FIG. 10 (step S60). The hole transport layer 24*a* is formed as a common layer that is common to the plurality of pixels by using a metal mask. Next, the light-emitting layer 24*b* (organic EL layer) is formed for each pixel 2 by vapor deposition (step S61). In other words, the light-emitting layer 24*b* is formed on the first electrodes 22 exposed in the openings in the edge cover film 23 and on the edge of the edge cover film 23 by vapor deposition using a metal mask 7. Next, the electron transport layer 24*c* is formed on the light-emitting layer 24*b* for each pixel 2. The electron transport layer 24*c* is formed by vapor deposition using a metal mask (step S62). Note that in the display device 100, the hole transport layer 24*a* is formed as a common layer that is common to the plurality of pixels 2 on the first electrode 22 by vapor deposition, whereas at least one of the light-emitting layer 24*b* or the electron transport layer 24*c* is formed for each pixel 2 on the first electrode 22 by vapor deposition.

Specifically, as shown in FIG. 11, the mask 7 that has openings in locations where the light-emitting layer 24*b* and the electron transport layer 24*c* are provided, in other words, in locations that overlap the first electrodes 22 exposed out of the edge cover film 23, is positioned on the hole transport layer 24*a* formed as a common layer that is common to the plurality of pixels 2 covering the photospacers PS, so as to face the substrate of the display panel 110 in which the TFT layer 4 is formed. The mask 7 is supported by the photospacers PS via the hole transport layer 24*a*, and a gap is formed between the mask 7 and the TFT layer 4. With the mask 7 being positioned in this manner, the light-emitting layer 24*b* is formed by heating and evaporating vapor deposition materials under reduced pressure as shown in FIG. 12. Furthermore, the electron transport layer 24*c* is formed on the light-emitting layer 24*b* in the same manner as the light-emitting layer 24*b*. After the hole transport layer 24*a*, the light-emitting layer 24*b*, and the electron transport layer 24*c* are formed, the second electrode 25 is formed on a stack body of the hole transport layer 24*a*, the light-emitting layer 24*b*, and the electron transport layer 24*c* as shown in FIG. 10 (step S63), which completes the manufacture of the light-emitting element layer 5.

Incidentally, the photospacers PS need to firmly support the mask 7 on the TFT layer 4. Here, it is impossible in the display area DA to position the photospacers PS in locations where the pixels 2 are formed in a plan view of the display panel 110. Therefore, the display area DA can only provide limited areas where the photospacers PS can be positioned. In contrast, the non-display area NA can provide less limited areas where the photospacers PS can be positioned than the display area DA. Therefore, more of the photospacers PS are invariably positioned in the non-display area NA than in the display area DA. In other words, the lateral cross-sectional areas of the photospacers PS account for a larger areal fraction per unit area in the non-display area NA than in the display area DA.

This difference in the areal fraction of the lateral cross-sectional areas of the photospacers PS per unit area between the display area DA and the non-display area NA creates adverse impact of stress concentration in locations of the mask 7 corresponding to the boundary portions of the display area DA and the non-display area NA. Accordingly, in the display device 100 in accordance with an embodiment, the adverse impact of this stress concentration can be restrained by employing a special arrangement in the photospacers PS as described in the following. In the following description, the special arrangement in the photospacers PS will be described with reference to FIG. 2 mentioned above.

The display device 100 includes the display panel 110 including: light-emitting elements (the first electrode 22, the hole transport layer 24*a*, the light-emitting layer 24*b*, the electron transport layer 24*c*, and the second electrode 25); the TFT layer 4 containing the thin film transistors Tr for switching the voltage applied to the light-emitting elements; and the plurality of photospacers PS on the TFT layer 4, as described earlier. This display panel 110 has the display area DA in which the thin film transistors Tr and the light-emitting elements are provided and the non-display area NA along the periphery of the display area DA. In addition, the non-display area NA includes: the frame area NA2; and the intermediate area NA1 between the display area DA and this frame area NA2.

In such a structure, the display device 100 includes the photospacers PS in the display area DA and the non-display area NA in such a manner as to satisfy the following relations. In other words, letting a first areal ratio be the areal fraction of the lateral cross-sectional areas of the photospacers PS (first spacers PS1) per unit area in the display area DA, a second areal ratio be the areal fraction of the lateral cross-sectional areas of the photospacers PS (second spacers PS2) per unit area in the intermediate area NA1, and a third areal ratio be the areal fraction of the lateral cross-sectional areas of the photospacers PS (third spacers PS3) per unit area in the frame area NA2, the first spacers PS1, the second spacers PS2, and the third spacers PS3 satisfy the relations: first areal ratio <second areal ratio <third areal ratio. Note that where the end of the protruding photospacer PS on the TFT layer 4 side is termed the "base end," and the end thereof on the side in contact with the mask 7 is termed the "tip end," the lateral cross-sectional area of the photospacer PS may be the lateral cross-sectional area of the photospacer PS at the base end. In the present specification, the lateral cross-sectional area of the photospacer PS at the base end is the lateral cross-sectional area of the photospacer PS as a reference in determining the areal fraction per unit area. This is however not the only possible implementation of the disclosure. Alternatively, for instance, the lateral cross-sectional area at a portion of the photospacer PS that has the largest area may be used. As another alternative, the lateral cross-sectional area of the photospacer PS at the tip end thereof, in other words, the contact surface of the photospacer PS with the mask 7, may be used.

Additionally, to satisfy the aforementioned relations, first areal ratio < second areal ratio < third areal ratio, the first spacers PS1, the second spacers PS2, and the third spacers PS3 may have the same shape and be arranged as in the following in the display device 100 in accordance with an embodiment. In other words, as shown in FIG. 2, the number of the first spacers PS1 per unit area in the display area DA, the number of the second spacers PS2 per unit area in the intermediate area NA1, and the number of the third spacers PS3 per unit area in the frame area NA2 may differ from each other. In other words, as shown in FIG. 2, the number of the first spacers PS1 per unit area is smaller than the number of the second spacers PS2 per unit area. In addition, the number of the second spacers PS2 per unit area is smaller than the number of the third spacers PS3 per unit area.

The number of the photospacers PS per unit area is gradually increased from the display area DA toward the frame area NA2 in the display device 100 in this manner. Then, the display device 100 is arranged to satisfy the aforementioned relations, first areal ratio < second areal ratio < third areal ratio. In this structure, the display device 100 allows only gentle changes in shape in the locations of the mask 7 corresponding to the boundary portions of the display area DA and the non-display area NA in placing the mask 7 on the photospacers PS. In addition, the weight of the mask 7 exerted on the photospacers PS supporting the mask 7 is increasingly distributed with an increase in the number of the photospacers PS per unit area. Accordingly, in the display device 100, the adverse impact of the weight of the mask 7 exerted on the photospacers PS can be gradually reduced from the display area DA toward the frame area NA2. Thus, the display device 100 can restrain the adverse impact of the stress concentration in the locations of the mask 7 corresponding to the boundary portions.

Therefore, the defects in properties of the thin film transistor Tr caused by the mask 7 coming into contact under strong force with those photospacers PS which are provided along the outermost periphery of the display area DA close to these boundary portions can be restrained. Note that the defects in properties of the thin film transistor Tr include, for example, the defects of the thin film transistor Tr caused by the electric charge accumulated in the mask 7 and discharged (ESD; electrostatic discharge) in proximity to the thin film transistor Tr.

In addition, if the hole transport layer 24a on the photospacers PS comes into contact with the mask 7 under strong force, the hole transport layer 24a is damaged, producing foreign objects. The display device 100 can restrain this mask 7 from coming into contact with the hole transport layer 24a under strong force in locations corresponding to the boundary portions of the display area DA and the non-display area NA. That can in turn restrain the contamination of the light-emitting elements by foreign objects and also prevent the degradation of the light-emitting elements. Hence, a highly reliable display device can be provided with a sufficiently reduced defect rate in the manufacture of the display device 100.

In addition, when the aforementioned relations, first areal ratio < second areal ratio < third areal ratio, are satisfied by the first spacers PS1, the second spacers PS2, and the third spacers PS3 differing in number per unit area from each other, the first spacers PS1, the second spacers PS2, and the third spacers PS3 may all have the same shape. When the first spacers PS1, the second spacers PS2, and the third spacers PS3 all have the same shape in this manner, the photospacers PS can be easily formed.

In addition, the photospacers PS may have the same lateral cross-sectional shape in the display area DA and the intermediate area NA1 where the light-emitting elements are formed as shown in FIG. 2 and have a different lateral cross-sectional shape in the frame area NA2. In this structure, the aforementioned relations, first areal ratio < second areal ratio < third areal ratio, may be satisfied by setting up at least in such a manner that the number of the first spacers PS1 per unit area is smaller than the number of the second spacers PS2 per unit area.

Figure 13:
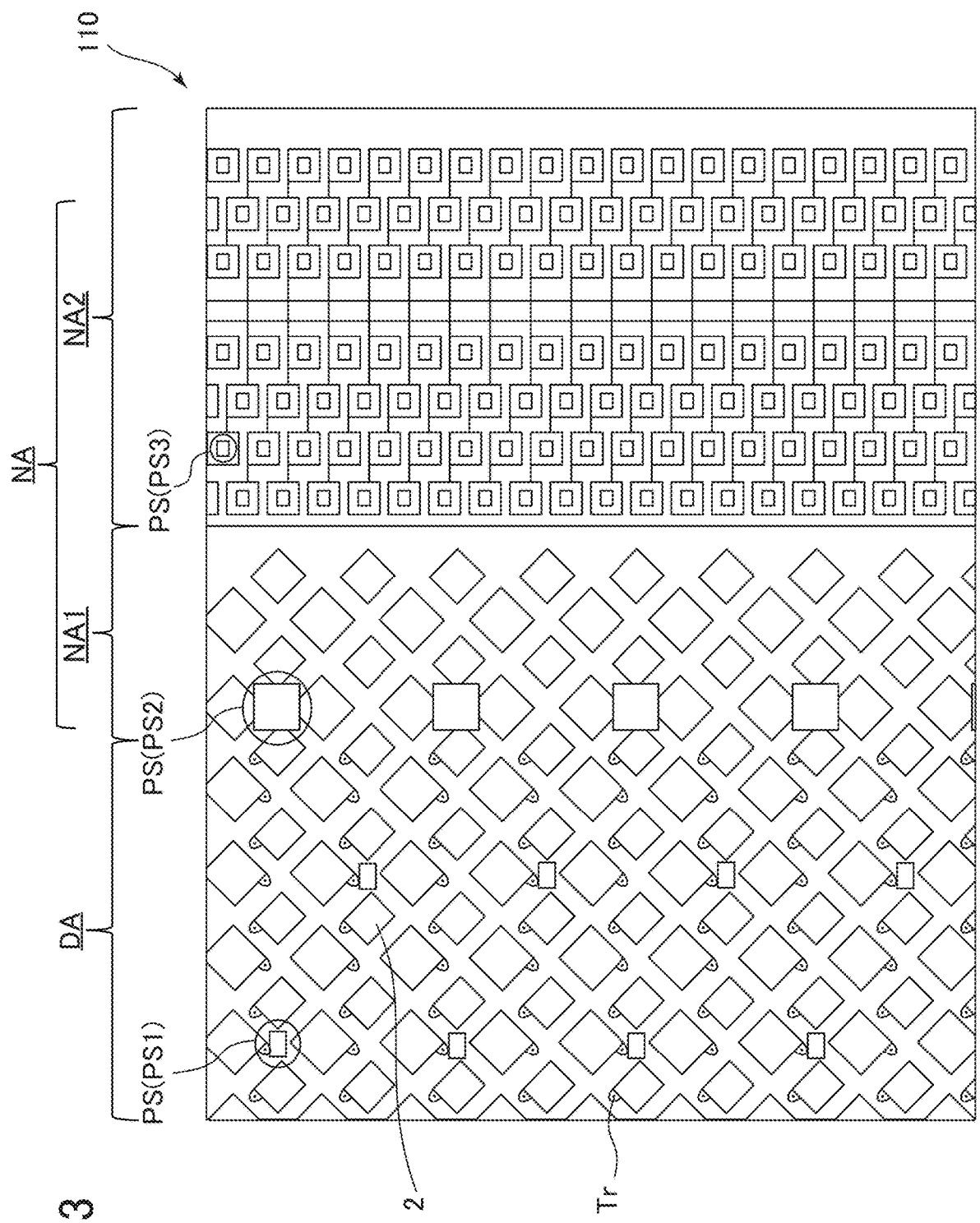
FIG. 13 is a partial enlarged view of region A of the display panel shown in FIG. 1.

Alternatively, as shown in FIG. 13, the aforementioned relations, first areal ratio < second areal ratio < third areal ratio, may be satisfied by setting up in such a manner that the lateral cross-sectional areas of the first spacers PS1 are smaller than the lateral cross-sectional areas of the second spacers PS2 in the display area DA. FIG. 13 is a partial enlarged view of region A of the display panel 110 shown in FIG. 1.

When the photospacers PS have lateral cross-sectional areas that differ in size in this manner to satisfy the relations, first areal ratio < second areal ratio < third areal ratio, the number of the photospacers PS can be reduced in comparison with a structure where all the photospacers PS have the same cross-sectional shape.

Note that FIG. 13 represents a structure where the relations, first areal ratio < second areal ratio < third areal ratio, are satisfied by the first spacers PS1 and the second spacers PS2 having lateral cross-sectional areas that differ in size from each other. However, the relations, first areal ratio < second areal ratio < third areal ratio, may be satisfied by the first spacers PS1, the second spacers PS2, and the third spacers PS3 having lateral cross-sectional areas that differ in size from each other. Alternatively, the relations, first areal ratio < second areal ratio < third areal ratio, may be satisfied by the first spacers PS1 and the third spacers PS3 having lateral cross-sectional areas that differ in size from each other. As another alternative, the relations, first areal ratio < second areal ratio < third areal ratio, may be satisfied by the second spacers PS2 and the third spacers PS3 having lateral cross-sectional areas that differ in size from each other.

As described here, the relations, first areal ratio < second areal ratio < third areal ratio, can be satisfied by at least two of the first spacers PS1, the second spacers PS2, and the third spacers PS3 having lateral cross-sectional areas that differ in size from each other. In addition, when the relations, first areal ratio < second areal ratio < third areal ratio, are satisfied by the photospacers PS having lateral cross-sectional areas that differ in size, the number of the photospacers PS can be reduced in comparison with a structure where all the photospacers PS have the same lateral cross-sectional shape.

Figure 14:
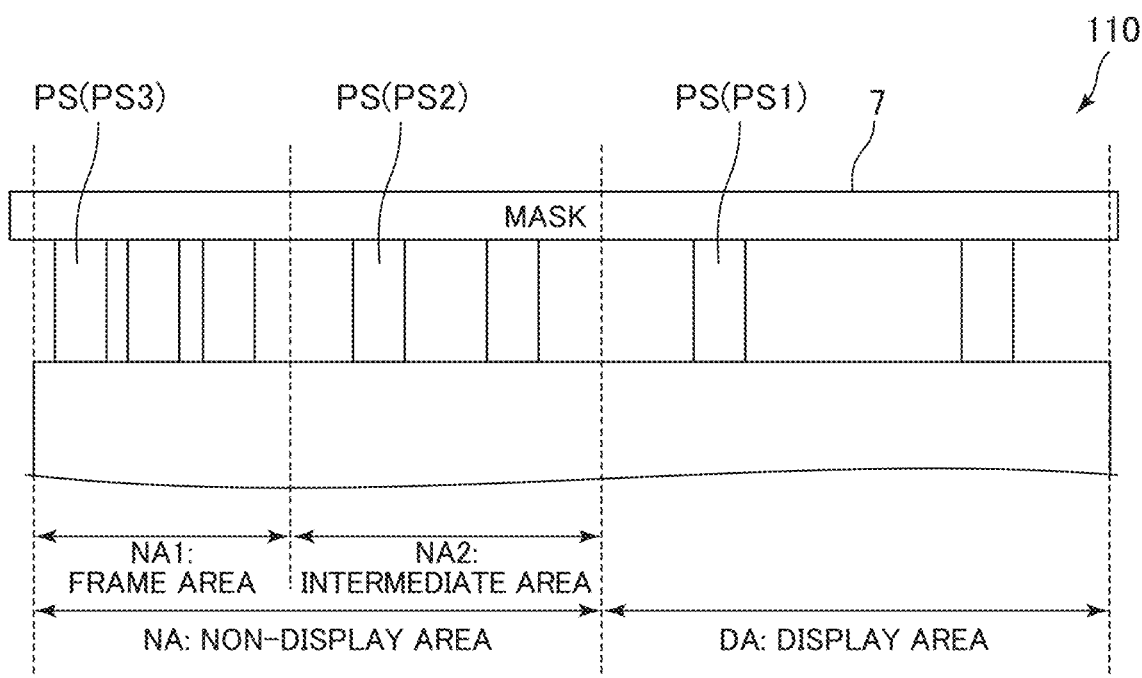
FIG. 14 is a schematic side view of a projection state of photospacers in a display panel of a display device in accordance with an embodiment of the present disclosure.

Incidentally, as shown in FIG. 14, the first spacers PS1, the second spacers PS2, and the third spacers PS3 have protruding shapes with the same protrusion amount from the top of the TFT layer 4 toward the direction of the mask 7. FIG. 14 is a schematic side view of a projection state of the photospacers PS in the display panel 110 of the display device 100 in accordance with an embodiment of the present disclosure. FIG. 14 schematically represents a projection state of the photospacers PS from the TFT layer 4 in the display panel 110 that is subjected to a step of forming the light-emitting elements. Note that although FIG. 14 shows all the photospacers PS as columnar members having an equal cross-sectional area of the lateral cross-sectional area for convenience of description, the shape(s) of the photospacers PS is not necessarily limited to such columnar members. The photospacers PS may have any shape so long as the photospacers PS can support the mask 7 in a prescribed position and do not disturb the display function of the display device 100. In addition, FIG. 14 omits the openings in the mask 7. Furthermore, additionally, FIG. 14 omits the hole transport layer 24a between the mask 7 and the photospacers PS.

Since the first spacers PS1, the second spacers PS2, and the third spacers PS3 have such a protruding shape that they protrude with the same protrusion amount as shown in FIG. 14, the gap dimensions between the mask 7 and the TFT layer 4 can be readily adjusted by controlling this protrusion amount.

Variation Example 1

Figure 15:
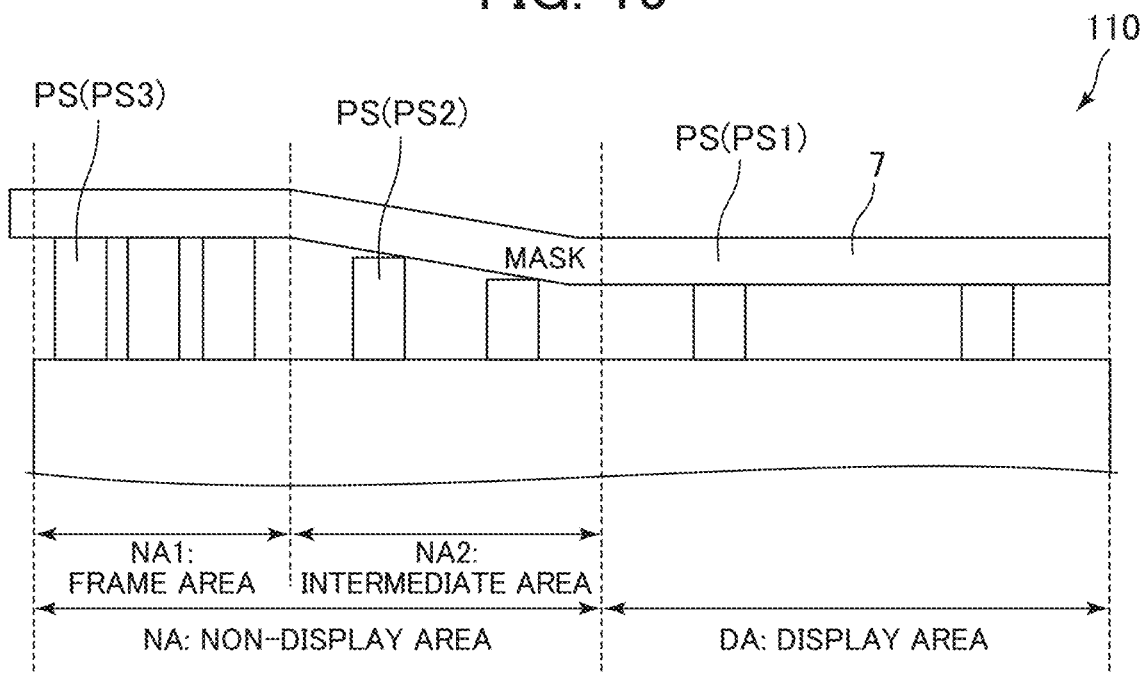
FIG. 15 is a schematic side view of a projection state of photospacers in a display panel of a display device in accordance with Variation Example 1 of an embodiment of the present disclosure.

The first spacers PS1, the second spacers PS2, and the third spacers PS3 have such a protruding shape that they protrude with the same protrusion amount in the display device 100 in accordance with an embodiment. However, in a display device 100 in accordance with Variation Example 1 of an embodiment, the structure of the display device 100 in accordance with the aforementioned embodiment is arranged so that the first spacers PS1, the second spacers PS2, and the third spacers PS3 have protrusion amounts from the TFT layer 4 that increase in this order as shown in FIG. 15. FIG. 15 is a schematic side view of a projection state of the photospacers PS in the display panel 110 of the display device 100 in accordance with Variation Example 1 of an embodiment of the present disclosure. FIG. 15 schematically represents a projection state of the photospacers PS from the TFT layer 4 in the display panel 110 that is subjected to a step of forming the light-emitting elements. Note that although FIG. 15 shows all the photospacers PS as columnar members having an equal cross-sectional area of the lateral cross-sectional area for convenience of description, the shape(s) of the photospacers PS is not necessarily limited to such columnar members. The photospacers PS may have any shape so long as the photospacers PS can support the mask 7 in a prescribed position and do not disturb the display function of the display device 100. In addition, FIG. 15 omits the openings in the mask 7. Furthermore, additionally, FIG. 15 omits the hole transport layer 24a between the mask 7 and the photospacers PS.

As described here, the display device 100 in accordance with Variation Example 1 is arranged so that the photospacers PS have protrusion amounts that increase from the display area DA toward the frame area NA2. Therefore, the gap between the TFT layer 4 and the mask 7 can be retained larger in the area, from the outermost periphery of the display area DA to the non-display area NA, that is susceptible to the adverse impact of stress concentration on the mask 7, than in the display area DA. Therefore, the mask 7 can be prevented from coming into contact under strong force with the first spacers PS1 in the display area DA, thereby damaging the first spacers PS1, and the defects in properties of the thin film transistor Tr can be prevented. Note that the protrusion amount of each photospacer PS can be controlled by using a photomask PM that has different light-blocking properties in the process of forming the photospacers PS in the aforementioned light-emitting element layer forming process.

The invention claimed is:

1. A display device comprising a display panel comprising:
   a light-emitting element;
   a transistor layer containing a transistor configured to switch a voltage applied to the light-emitting element; and
   a plurality of spacers on the transistor layer, wherein
   the display panel has a display area including the transistor and the light-emitting element and also has a non-display area along a periphery of the display area,
   the non-display area includes a frame area and also includes an intermediate area between the display area and the frame area, and
   letting a first areal ratio be an areal fraction of lateral cross-sectional areas of the plurality of spacers per unit area in the display area, a second areal ratio be an areal fraction of lateral cross-sectional areas of the plurality of spacers per unit area in the intermediate area, and a third areal ratio be an areal fraction of lateral cross-sectional areas of the plurality of spacers per unit area in the frame area, the plurality of spacers are arranged so as to satisfy relations, first areal ratio <second areal ratio <third areal ratio.

2. The display device according to claim 1, wherein the plurality of spacers include first spacers in the display area, second spacers in the intermediate area, and third spacers in the frame area, and
   at least two of a count of the first spacers per unit area in the display area, a count of the second spacers per unit area in the intermediate area, and a count of the third spacers per unit area in the frame area differ.

3. The display device according to claim 1, wherein the plurality of spacers include first spacers in the display area, second spacers in the intermediate area, and third spacers in the frame area, and
   at least two of a lateral cross-sectional area of the first spacers, a lateral cross-sectional area of the second spacers, and a lateral cross-sectional area of the third spacers differ in size.

4. The display device according to claim 2, wherein the third spacers, the second spacers, and the first spacers have protrusion amounts that decrease in a stated order.

5. A display device comprising a display panel comprising:
   a light-emitting element;
   a transistor layer containing a transistor configured to switch a voltage applied to the light-emitting element; and
   a plurality of spacers of a same shape on the transistor layer, wherein
   the display panel has a display area including the transistor and the light-emitting element and also has a non-display area along a periphery of the display area,
   the non-display area includes a frame area and also includes an intermediate area between the display area and the frame area, and
   letting a first count ratio be a count of the plurality of spacers per unit area in the display area, a second count ratio be a count of the plurality of spacers per unit area in the intermediate area, and a third count ratio be a count of the plurality of spacers per unit area in the frame area, the plurality of spacers are arranged so as to satisfy relations, first count ratio <second count ratio <third count ratio.

6. A method of manufacturing a display device including a display panel including: a light-emitting element; a transistor layer containing a transistor configured to switch a voltage applied to the light-emitting element; and a plurality of spacers on the transistor layer, wherein the display panel has a display area including the transistor and the light-emitting element and also has a non-display area along a periphery of the display area, and the non-display area includes a frame area and also includes an intermediate area between the display area and the frame area, the method comprising:
   a step of forming the plurality of spacers on the transistor layer so as to satisfy relations, first areal ratio <second areal ratio <third areal ratio, where the first areal ratio is an areal fraction of lateral cross-sectional areas of the plurality of spacers per unit area in the display area, the second areal ratio is an areal fraction of lateral cross-sectional areas of the plurality of spacers per unit area in the intermediate area, and the third areal ratio is an areal fraction of lateral cross-sectional areas of the plurality of spacers per unit area in the frame area.

* * * * *